US012545999B2

(12) United States Patent
Dezelah et al.

(10) Patent No.: US 12,545,999 B2
(45) **Date of Patent: *Feb. 10, 2026**

(54) METHOD OF DEPOSITING VANADIUM METAL

(71) Applicant: ASM IP Holding B.V., Almere (NL)

(72) Inventors: Charles Dezelah, Helsinki (FI); Eric James Shero, Phoenix, AZ (US); Qi Xie, Wilsele (BE); Giuseppe Alessio Verni, Ottignies (BE); Petro Deminskyi, Helsinki (FI)

(73) Assignee: ASM IP Holding B.V., Almere (NL)

(*) Notice: Subject to any disclaimer, the term of this patent is extended or adjusted under 35 U.S.C. 154(b) by 0 days.

This patent is subject to a terminal disclaimer.

(21) Appl. No.: 18/522,778

(22) Filed: Nov. 29, 2023

(65) Prior Publication Data

US 2024/0093363 A1 Mar. 21, 2024

Related U.S. Application Data

(63) Continuation of application No. 17/504,839, filed on Oct. 19, 2021, now Pat. No. 11,873,557.

(60) Provisional application No. 63/104,172, filed on Oct. 22, 2020.

(51) Int. Cl.

*C23C 16/06* (2006.01)
*C23C 16/455* (2006.01)
*C23C 16/52* (2006.01)

(52) U.S. Cl.

CPC .. *C23C 16/45534* (2013.01); *C23C 16/45553* (2013.01); *C23C 16/52* (2013.01)

(58) Field of Classification Search

CPC ........ C23C 16/06; C23C 16/455; C23C 16/52

See application file for complete search history.

(56) References Cited

U.S. PATENT DOCUMENTS 3,894,164 A * 7/1975 Dismukes .......... C09K 11/7794 252/301.16
5,139,825 A * 8/1992 Gordon .................. C23C 16/34 427/314
5,178,911 A 1/1993 Gordon et al.
5,449,525 A * 9/1995 Lundberg ............... G11B 5/842 427/430.1
6,156,395 A * 12/2000 Zhang .................. C23C 16/405 427/126.3
8,460,989 B2 6/2013 Blasco et al.

(Continued)

FOREIGN PATENT DOCUMENTS

JP S58161767 A 9/1983

OTHER PUBLICATIONS

Prasadam, V.P., et al., "Atomic Layer Deposition of Vanadium Oxides: process and application review". Materials Today Chemistry 12 (2019) 396-423.*

(Continued)

*Primary Examiner* — Bret P Chen
(74) *Attorney, Agent, or Firm* — Snell & Wilmer L.L.P.

(57) ABSTRACT

The manufacture of semiconductor devices may include methods of forming vanadium metal on a substrate. The methods comprise providing a substrate in a reaction chamber, providing a vanadium precursor to the reaction chamber in a vapor phase and providing a reducing agent to the reaction chamber in a vapor phase to form vanadium metal on the substrate.

9 Claims, 2 Drawing Sheets

(56) References Cited

U.S. PATENT DOCUMENTS 11,873,557 B2 * 1/2024 Dezelah ............ C23C 16/45534
2003/0168127 A1 * 9/2003 Hamamura ............. C23C 22/44 148/248
2005/0186342 A1 * 8/2005 Sager ................... C25D 7/0614 427/248.1
2007/0231561 A1 * 10/2007 Pellerite .................. B32B 27/08 428/323
2009/0263965 A1 * 10/2009 Gordon ............. H01L 23/53238 438/643
2010/0010239 A1 * 1/2010 Albert ................ C07D 307/935 560/60
2010/0270519 A1 * 10/2010 Blackman ............. C23C 16/453 252/586
2011/0151639 A1 * 6/2011 Lim ......................... H10D 1/68 257/E21.011
2015/0105573 A1 * 4/2015 Romero ................ C07F 15/045 556/32
2015/0380296 A1 * 12/2015 Antonelli .......... H01L 21/76883 438/643
2016/0083405 A1 3/2016 Lansalot-Mantras et al.
2016/0247994 A1 * 8/2016 Arnepalli ................ C07F 11/00
2017/0129908 A1 * 5/2017 Rekken ............. H01L 21/02271
2018/0130666 A1 5/2018 Rahtu et al.
2018/0230616 A1 * 8/2018 Groechel ............... C25D 5/003
2019/0177346 A1 6/2019 Okabe et al.

OTHER PUBLICATIONS

Fix, Renaud, et al., "Chemical Vapor Deposition of Vanadium, Niobium, and Tantalum Nitride Thin Films". Chem. Mater. 5, 614-619.*

Mantoux, A., et al., "Vanadium Oxide Films Synthesized by CVD and Used as Positive Electrodes in Secondary Lithium Batteries". Journal of The Electrochemical Society, 151 (3) 2004, A368-A373.*

Houssain, Mongur, et al., "Chemical Vapor Deposition of 2D Vanadium Disulfide and Diselenide and Raman Characterization of the Phase Transitions". Advanced Materials Interfaces, 2018, 5, 1800528, pp. 1-6.*

* cited by examiner

METHOD OF DEPOSITING VANADIUM METAL

CROSS-REFERENCE TO RELATED APPLICATIONS

This application is a continuation of, and claims priority to, U.S. patent application Ser. No. 17/504,839 filed Oct. 19, 2021 titled METHOD OF DEPOSITING VANADIUM METAL, STRUCTURE, DEVICE AND A DEPOSITION ASSEMBLY; which claims priority to U.S. Provisional Application Ser. No. 63/104,172 filed on Oct. 22, 2020, titled METHOD OF DEPOSITING VANADIUM METAL, STRUCTURE, DEVICE AND A DEPOSITION ASSEMBLY, the disclosures of which are hereby incorporated by reference in their entirety.

FIELD

The present disclosure generally relates to semiconductor processing methods and systems in the field integrated circuit manufacture. More particularly, the disclosure relates to methods and systems for depositing vanadium metal and a vanadium metal-containing layer by a deposition process and to structures and devices comprising vanadium metal.

BACKGROUND

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

Vanadium metal may have many of the advantages sought in the art. However, the growth of elemental films of electropositive metals is inherently challenging, with few known solutions, all of which have significant limitations. Their reduction to the elemental form often requires unusual conditions or plasma-based approaches. Vanadium metal layers fall into this category, and despite the difficulty of depositing high quality layers of this material, significant potential applications exist.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Vanadium metal layers may be useful for, for example, front end of line (FEOL) applications, including as gate metal, as source/drain contact material, as silicide contact layer, or even as a component in threshold voltage (Vt) tuning layers. Vanadium metal could also serve as a back end of line (BEOL) conductive metal in, for example, metal contact. It could be used as interconnect material as, for example, seed layer, adhesion layer, barrier layer or as metal fill.

Various embodiments of the present disclosure relate to methods of forming vanadium metal-containing material, and layers comprising vanadium metal. Embodiments of the current disclosure further relate to structures and devices formed using such methods, and to a deposition assembly for performing the methods and/or for forming the structures and/or devices according to the current disclosure. In general, various embodiments of the disclosure provide improved methods of forming vanadium metal-containing material and layers that exhibit properties sought in the art.

As used herein, a "structure" can be or include a substrate as described herein. Structures can include one or more layers overlying the substrate, such as one or more layers formed according to a method according to the current disclosure.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION OF EXEMPLARY EMBODIMENTS

Figure 1A:
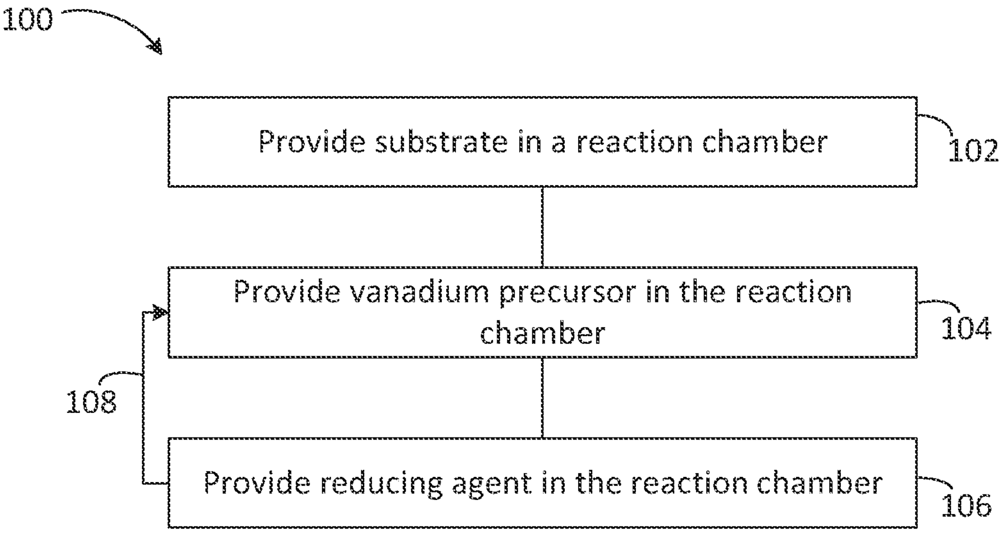
FIGS. 1A and 1B, illustrate embodiments of a method according to the current disclosure.

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The current disclosure relates to a method of depositing vanadium metal on a substrate. The method comprises providing a substrate in a reaction chamber, providing a vanadium precursor in the reaction chamber in vapor phase and providing a reducing agent to the reaction chamber in a vapor phase to form vanadium metal on the substrate. In the current disclosure, vanadium is deposited predominantly, or in some embodiments substantially completely or completely, as an elemental metal. Thus, in some embodiments, the oxidation state of vanadium is zero.

In some embodiments, vanadium metal is deposited as vanadium metal-containing layer. As used herein, a "vanadium metal-containing layer" can be a material layer that contains vanadium in elemental form. Thus, the oxidation state of vanadium may be zero. A vanadium metal-containing layer can include additional elements, such as oxygen, and the like. In some embodiments, the vanadium metal-containing layer may comprise significant proportions of other elements than vanadium. Thus, vanadium metal-containing layer comprises, consist essentially of, or consist of vanadium metal.

In some embodiments, the vanadium metal-containing layer may be a seed layer. A seed layer may be used to enhance the deposition of another layer. A seed layer may comprise two metals to form a binary alloy, or three metals to form a ternary alloy, or four metals to form a quaternary alloy. The alloy composition may be selected to optimize oxidation resistance, adhesion or other properties of the seed layer. The metals to be used in the alloy may include but are not limited to zirconium, chromium, titanium and ruthenium. In some embodiments, other transition metals may be used instead or in addition to the above-mentioned ones. Examples of vanadium alloys are vanadium-chromium, vanadium-titanium and vanadium-ruthenium in variable proportions.

As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

In some embodiments, a vanadium metal-containing layer may comprise, for example, 80, 90, 95 or 99 atomic percentage (at. %) of vanadium. In some embodiments, a vanadium metal-containing layer may consist essentially of, or consist of vanadium. In some embodiments, vanadium metal-containing layer may consist essentially of, or consist of vanadium metal. Layer consisting of vanadium metal may include an acceptable amount of impurities, such as oxygen, carbon, chlorine or other halogen, and/or hydrogen that may originate from one or more precursors used to deposit the vanadium metal-containing layer. As used herein, vanadium metal means the elemental form of vanadium, i.e. vanadium element in an oxidation state zero.

In some embodiments, a vanadium content of the vanadium metal-containing layer is from at least 1.0 atomic percent (at. %) to at most 99.5 at. %, or from at least 3.0 at. % to at most 97.0 at. %, or from at least 5.0 at. % to at most 95.0 at. %, or from at least 10.0 at. % to at most 90.0 at. %, or from at least 20.0 at. % to at most 80.0 at. %, or from at least 30.0 at. % to at most 70.0 at. %, or from at least 40.0 at. % to at most 60.0 at. %.

In some embodiments, a vanadium metal-containing layer may contain from 0.05 atomic percent (at. %) to 99.0 at. %, or from 3.0 at. % to 97.0 atomic percent, or from 5.0 atomic percent to 95.0 atomic percent, or from 10.0 atomic percent to 90.0 atomic percent, or from 20.0 atomic percent to 80.0 atomic percent, or from 30.0 atomic percent to 70.0 atomic percent, or from 40.0 atomic percent to 60.0 atomic percent oxygen and/or carbon and/or nitrogen and/or other additional elements.

The substrate may be any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material. Substrate may include nitrides, for example TiN, oxides, insulating materials, dielectric materials, conductive materials, metals, such as such as tungsten, ruthenium, molybdenum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The method of depositing vanadium metal according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. A reductant may be a reactant.

The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. In addition to inert gases and gases taking part in the reactions (collectively considered "process gases"), the process environment may contain other gases. For example, a gas other than a process gas, i.e., a gas introduced without passing through a precursor injector system, other gas distribution device, or the like, can be used for, e.g., sealing the reaction space, and can include a seal gas.

As used herein, "a vanadium precursor" includes a gas or a material that can become gaseous and that can be represented by a chemical formula that includes vanadium, such as one or more of vanadium halides, vanadium alkylamido compounds and vanadium amidinate compounds. Vanadium precursor may be an organic or inorganic molecule. In some embodiments, vanadium precursor is provided in a mixture of two or more compounds. In a mixture, the other compounds in addition to the vanadium precursor may be inert compounds or elements. In some embodiments, vanadium precursor is provided in a composition.

Compositions suitable for use as composition can include a vanadium compound and an effective amount of one or more stabilizing agents. Composition may be a solution. The stabilizing agents can or can facilitate a reduction of unwanted thermal decomposition of the vanadium precursor, such as decomposition that might otherwise occur during transport or storage of the vanadium precursor. In some embodiments, the stabilizing agent can bond and/or form adducts with the vanadium precursor and/or include a solvent that stabilizes the vanadium precursor. A stabilizing agent can include an adduct-forming compound. A stabilizing agent can include an aprotic compound. A stabilizing compound may, for example, contain one or more heteroatoms bearing a lone pair of electrons capable of forming a dative bond (co-ordinate bond) to vanadium to form an adduct. A stabilizing agent may selected in such a way as to not impact the delivery of the vanadium precursor vapor or vanadium precursor adduct vapor, or in such a way as to minimize incorporation of the stabilizer into the vanadium metal-containing layer as an impurity. A stabilizing agent may be introduced in a quantity ranging from trace "catalytic inhibitor" amounts, up to 1:1 stoichiometric quantities. The desired ratio can depend, for example, on the particular vanadium precursor and desired degree of stabilization.

One or more stabilizing agents may be used with the vanadium precursor. At least one of the one or more stabilizing agents can be or include an organic molecule. The organic molecule can include one or more of nitrogen, oxygen, sulfur and/or oxygen heteroatom. At least one of the one or more stabilizing agents can be selected from the group consisting of a tertiary amine of the formula, $NR_3$, where all —R groups are independently a C1-C20 alkyl or a C1-C20 aryl group; a tertiary phosphine of the formula, $PR_3$, where all —R groups are independently a C1-C20 alkyl or a C1-C20 aryl group; an ether of the formula, $OR_2$, where all —R groups are independently a C1-C20 alkyl or a C1-C20 aryl group; a dialkyl sulfide, diaryl sulfide, or mixed alkyl/aryl sulfide of the formula, $SR_2$, where all —R groups are independently a C1-C20 alkyl or a C1-C20 aryl group; an aromatic heterocyclic amine, such as pyridine, pyridazine, pyrimidine, pyrazine, or 1,2,4-triazine, and alkyl or aryl substituted versions thereof; an aprotic non-aromatic heterocyclic amine, such as N-alkylpiperidine, N,N'-dialkylpiperazine, N-alkylpyrrolidine, N-alkylpyrrole, N-alkylpyrroline, N,N'-dialkylimidazolidine, and similar compounds, where alkyl can be a C1-C20 hydrocarbon group; an heterocyclic ether, such as furan, tetrahydrofuran, pyran, tetrahydropyran, 1,4-dioxane, 1,4-dioxine, and similar compounds, as well as alkyl or aryl substituted versions thereof; an heterocyclic thioether, such as thiophene, tetrahydrothiophene, thiazole, thiane, thiopyran, dithiane, and similar compounds, as well as common alkyl or aryl substituted versions thereof, or the like. The solution or composition can include any suitable number of stabilizing agents, such as two or more stabilizing agents, wherein one or more of the two or more stabilizing agents can be selected from the list above. The two or the two or more stabilizing agents can include any combination of two or more stabilizing agents, including at least one stabilizing agent from the examples provided above.

In accordance with examples of the disclosure, the composition may be a liquid or a gas at normal temperature and pressure.

In some embodiments, vanadium precursor comprises an inorganic compound. In some embodiments, the vanadium precursor comprises a vanadium halide or a vanadium oxyhalide. A vanadium halide can be or include a vanadium chloride, such as vanadium tetrachloride. In some embodiments, vanadium precursor comprises vanadium fluoride, vanadium chloride, vanadium bromide, vanadium iodide, vanadium oxyfluoride, vanadium oxychloride, vanadium oxybromide or vanadium oxyiodide. In some embodiments, the vanadium precursor is selected from $VCl_4$ and $VOCl_3$.

In some embodiments, a vanadium precursor comprises an organic compound. An organic vanadium precursor may comprise a vanadium alkylamido compound or a vanadium dialkylamido compound. An organic vanadium precursor may comprise a vanadium amidinate, vanadium alkoxide and vanadyl alkoxide, vanadium beta-diketonate, as well as vanadium cyclopentadienyl compound. In some embodiments, vanadium precursor comprises $V(NMe_2)_4$, $V(NEt_2)_4$ and/or $V(NEtMe)_4$.

In the method according to the current disclosure, the vanadium precursor may be in vapor phase when it is in a reaction chamber. The vanadium precursor may be partially gaseous or liquid, or even solid at some points in time prior to being provided in the reaction chamber. In other words, a vanadium precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof.

In this disclosure, "gas" can include material that is a gas at normal temperature and pressure (NTP), a vaporized solid and/or a vaporized liquid. A gas may be constituted by a single gas or a mixture of gases, depending on the context. Vanadium precursor may be provided to the reaction chamber in gas phase.

In the method according to the current disclosure, a reducing agent is provided to the reaction chamber in a vapor phase to form vanadium metal on the substrate. The term "reducing agent" may refer to a gas or a material that can become gaseous and that can reduce the vanadium precursor into vanadium metal. Reducing agent may be provided to the reaction chamber in gas phase. In the method according to the current disclosure, the reducing agent may be contacted with the substrate comprising a chemisorbed vanadium precursor. The reduction of a vanadium precursor to vanadium metal may take place at the substrate surface. In some embodiments, the reduction may take place at least partially in the gas phase. The introduction of vanadium precursor and the reducing agent into the reaction chamber may at least partially overlap. In some embodiments, the introduction of vanadium precursor and the reducing agent into the reaction chamber may be simultaneous. However, in some embodiments, introduction of vanadium precursor and the reducing agent into the reaction chamber may be at least partially separate.

A reducing agent according to the current disclosure may comprise hydrogen. In some embodiments, a reducing agent according to the current disclosure comprises molecular hydrogen ($H_2$) or plasma derived of $H_2$. A reducing agent according to the current disclosure may comprise boron. In some embodiments, the reducing agent comprises, consist essentially of, or consist of diborane ($B_2H_6$) or neutral ligand adducts of borane ($BH_3$).

In some embodiments, a reducing agent according to the current disclosure comprises nitrogen. In some embodiments, reducing agent may comprise, consist essentially of, or consist of hydrazine, or a derivative thereof. In some embodiments, a reducing agent may comprise an alkylhydrazine or a dialkylhydrazine. In some embodiments, a reducing agent may comprise a diazenyl compound. The diazenyl compound may be azo-tert-butane. In some embodiments, the reducing agent may comprise, consist essentially of, or consist of 1,1-diethylhydrazine, 1-ethyl-1-methylhydrazine, isopropylhydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, or azo-tert-butane.

The reducing agent may comprise, consist essentially of, or consist of one or more hydrocarbon-substituted hydrazine reducing agent. In some embodiments of the disclosure, a method may comprise selecting the substituted hydrazine to comprise an alkyl group. Each alkyl group may comprise one or more, such as two, three, four, five, six, seven or eight carbon atoms. The number of alkyl groups in a substituted hydrazine reducing agent may be one, two, three or four. For the purposes of the current disclosure, an alkyl group may be an aryl group. Thus, the reducing agent according to the current disclosure may comprise phenol hydrazine, or diphenol hydrazine, for example.

In the current disclosure, "alkyl group" refers to a saturated or unsaturated hydrocarbon chain comprising at least one carbon atom, such as, but not limited to, methyl, ethyl, propyl, butyl, pentyl, hexyl, heptyl and octyl and isomers thereof, such as n-, iso-, sec- and tert-isomers. An alkyl group may be linear, branched or cyclic, and may embrace all structural isomer forms of the alkyl group. An alkyl group may be substituted. A substituent of an alkyl group may be a single atom, such as a halogen, or a functional group, such as a hydroxyl group. In some embodiments of the disclosure, the alkyl-hydrazine may comprise at least one hydrogen bonded to nitrogen. In some embodiments of the disclosure, the alkyl-hydrazine may comprise at least two hydrogens bonded to nitrogen. In some embodiments of the disclosure, the alkyl-hydrazine may comprise at least one hydrogen bonded to nitrogen and at least one alkyl chain bonded to nitrogen. In some embodiments of the disclosure, the alkyl-hydrazine may comprise one or more of tertbutylhydrazine ($C_4H_9N_2H_3$), dimethylhydrazine (such as 1,1-dimethyl hydrazine, 1,2-dimethyl hydrazine) or diethylhydrazine. In some embodiments of the disclosure, the substituted hydrazine has at least one hydrocarbon group attached to nitrogen. In some embodiments of the disclosure, the substituted hydrazine has at least two hydrocarbon groups attached to nitrogen. In some embodiments of the disclosure, the substituted hydrazine has at least three hydrocarbon groups attached to nitrogen. In some embodiments of the disclosure, the substituted hydrazine has at least one C1-C3 hydrocarbon group attached to nitrogen. For example, the alkyl-hydrazine may comprise one C1-C3 alkyl group attached to a nitrogen atom, or the alkyl-hydrazine may comprise one C1-C3 alkyl group attached to both nitrogen atoms, or the alkyl-hydrazine may comprise two C1-C3 alkyl groups attached to one nitrogen atom, or the alkyl-hydrazine may comprise two C1-C3 alkyl groups attached to both nitrogen atoms. In some embodiments of the disclosure, the alkyl-hydrazine has at least one C4-C10 alkyl group attached to nitrogen. For example, in the alkyl-hydrazine may comprise one C4-C10 alkyl group attached to a nitrogen atom, or the alkyl-hydrazine may comprise one C4-C10 alkyl group attached to both nitrogen atoms, or the alkyl-hydrazine may comprise two C4-C10 alkyl groups attached to one nitrogen atom, or the alkyl-hydrazine may comprise two C4-C10 alkyl groups attached to both nitrogen atoms.

The substituted hydrazine may comprise an aromatic substituent. The substituted hydrazine may comprise one, two, three or four aromatic substituents attached to nitrogen atoms. In some embodiments, substituted hydrazine comprises one aromatic substituent attached to a nitrogen atom. In some embodiments, substituted hydrazine comprises two aromatic substituents. The two aromatic substituents may be attached to the same or to different nitrogen atoms. In some embodiments, substituted hydrazine comprises three aromatic substituents, and in some embodiments substituted hydrazine comprises four aromatic substituents. Each aromatic substituent may be independently substituted with one or more substituents, including single atoms or functional groups. In some embodiments, the substituted hydrazine may comprise one or more alkyl groups and one or more aromatic substituents.

In some embodiments of the disclosure, the substituted hydrazine has linear, branched or cyclic or aromatic hydrocarbon group attached to nitrogen. In some embodiments of the disclosure the substituted hydrazine comprises substituted hydrocarbon group attached to nitrogen.

In some embodiments of the disclosure, the substituted hydrazine has the following formula:

$$R^{I}R^{II}—N—NR^{III}R^{IV} \quad (1)$$

In the substituted hydrazine according to formula (1), $R^{I}$ can be selected from hydrocarbon group, such as linear, branched, cyclic, aromatic or substituted hydrocarbon group and each of the $R^{II}$, $R^{III}$, $R^{IV}$ groups can be independently selected to be hydrogen or hydrocarbon groups, such as linear, branched, cyclic, aromatic or substituted hydrocarbon group.

In some embodiments in the substituted hydrazine according to formula (1), each of the $R^{I}$, $R^{II}$, $R^{III}$, $R^{IV}$ can be C1-C10 hydrocarbon, C1-C3 hydrocarbon, C4-C10 hydrocarbon or hydrogen, such as linear, branched, cyclic, aromatic or substituted hydrocarbon group. In some embodiments at least one of the $R^{I}$, $R^{II}$, $R^{III}$, $R^{IV}$ groups comprises aromatic group such as phenyl group. In some embodiments at least one of the $R^{I}$, $R^{II}$, $R^{III}$, $R^{IV}$ groups comprises methyl, ethyl, n-propyl, i-propyl, n-butyl, i-butyl, s-butyl, tertbutyl group or phenyl group. In some embodiments at least two of the each $R^{I}$, $R^{II}$, $R^{III}$, $R^{IV}$ groups can be independently selected to comprise methyl, ethyl, n-propyl, i-propyl, n-butyl, i-butyl, s-butyl, tertbutyl group or phenyl group. In some embodiments $R^{II}$, $R^{III}$ and $R^{IV}$ groups are hydrogen. In some embodiments at least two one of the $R^{II}$, $R^{III}$, $R^{IV}$ groups are hydrogen. In some embodiments at least one of the $R^{II}$, $R^{III}$, $R^{IV}$ groups are hydrogen. In some embodiments all of the $R^{II}$, $R^{III}$, $R^{IV}$ groups are hydrocarbons.

A reducing agent according to the current disclosure may comprise aluminum. In some embodiments, the reducing agent comprises aluminum hydride ($AlH_3$) or a neutral ligand adduct of aluminum hydride. In some embodiments, the reducing agent comprises an amino complex containing an Al—H bond or an amido complex containing an Al—H bond. In some embodiments, the reducing agent comprises an organometallic compound. In some embodiments, the organometallic compound comprises aluminum. The organometallic compound may comprise, consist essentially of, or consist of trimethylaluminum, triethylaluminum, triisopropylaluminum, tri-tert-butylaluminum or diisobutylaluminum hydride.

In some embodiments, the reducing agent comprises an organic molecule, i.e. the reducing agent may be an organic reducing agent. An organic reducing agent may comprise a carboxylic acid, such as formic acid or oxalic acid. An organic reducing agent may comprise an aldehyde, such as formaldehyde or glyoxal. An organic reducing agent may comprise 1,2-diimine or a metal complex of a 1,2-diimine.

In the current disclosure, the deposition process may comprise a cyclical deposition process, such as an atomic layer deposition (ALD) process or a cyclical chemical vapor deposition (VCD) process. The term "cyclical deposition process" can refer to the sequential introduction of precursors and/or reducing agent(s) into a reaction chamber to deposit material, such as vanadium metal-containing material, on a substrate. Cyclic deposition includes processing techniques such as atomic layer deposition (ALD), cyclical chemical vapor deposition (cyclical CVD), and hybrid cyclical deposition processes that include an ALD component and a cyclical CVD component. The process may comprise a purge step between providing precursors or between providing a precursor and a reducing agent in the reaction chamber.

The process may comprise one or more cyclical phases. In some embodiments, the process comprises or one or more acyclical phases. In some embodiments, the deposition process comprises the continuous flow of at least one precursor. In some embodiments, a reducing agent may be continuously provided in the reaction chamber. In such an embodiment, the process comprises a continuous flow of a reducing agent. In some embodiments, the method according to the current disclosure comprises alternatively and sequentially providing a vanadium precursor and a reducing agent in the reaction chamber and purging the reaction chamber between providing the vanadium precursor and the reducing agent in the reaction chamber.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor (s)/reactive gas(es), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or submonolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Reactant may be a reducing agent.

CVD type processes typically involve gas phase reactions between two or more precursors and/or reactants. The precursors and/or reactants can be provided simultaneously to the reaction space or substrate, or in partially or completely separated pulses. The substrate and/or reaction space can be heated to promote the reaction between the gaseous reactants. In some embodiments the reactants are provided until a layer having a desired thickness is deposited. In some embodiments, cyclical CVD processes can be used with multiple cycles to deposit a thin film having a desired thickness. In cyclical CVD processes, the reactants may be provided to the reaction chamber in pulses that do not overlap, or that partially or completely overlap.

In some embodiments, vanadium precursor, reducing agent or both are provided to the reaction chamber in pulses. The length of a vanadium precursor or a reducing agent pulse may be, for example, from about 0.01 s to about 60 s, for example from about 0.01 s to about 5 s, or from about 5 s to about 10 s, or from about 10 s to about 30 s, or from about 10 s to about 60 s, or from about 20 s to about 60 s. The selection of an appropriate pulse time may depend on the substrate topology. For higher aspect ratio structures, longer pulse times may be needed to obtain sufficient surface saturation in different areas of a high aspect ratio structure. For process optimization purposes, shorter pulse times might be preferred as long as sufficient layer quality can be achieved. For example, the length of a vanadium precursor or reducing agent pulse may be about 0.01 s, 0.03 s, 0.05 s, 0.1 s, 0.2 s, 0.5 s, 1 s, 1.5 s, 2 s, 2.5 s, 3 s, 4 s, 5 s, 7 s, 10 s, 12 s, 14 s or 16 s. In some embodiments, a vanadium precursor or reducing agent pulse time may be from about 15 to about 20 s, or from about 15 s to about 30 s, or from about 15 s to about 25 s, such as 18 s, 22 s, 26 s or 28 s or 31 s. In some embodiment, the pulse time for a vanadium precursor or a reducing agent may range from about 10 s to about 60 s, from about 30 s to about 60 s, and the pulse time may be, for example, about 25 s, 35 s, 45 s or 50 s. In certain embodiments, pulse times in the range of several minutes may be used for vanadium precursor and reducing agent. The pulse times for vanadium precursor and reducing agent vary independently according to process in question. In some embodiments, vanadium precursor pulse time is longer than reducing agent pulse time. In some embodiments, reducing agent pulse time is longer than vanadium precursor pulse time. In some embodiments, vanadium precursor pulse time is same as reducing agent pulse time.

In some embodiments, vanadium precursor may be pulsed more than one time, for example two, three or four times, before a reducing agent is pulsed to the reaction chamber. Similarly, there may be more than one pulse, such as two, three or four pulses, of a reducing agent before vanadium precursor is pulsed (i.e. provided) to the reaction chamber. In some embodiments, there is a purge step between every pulse. Thus, the reaction chamber may be purged also between two pulses of the same chemistry, such as a vanadium precursor or a reducing agent.

During the pulsing of the vanadium precursor over the substrate, the flow rate of the vanadium precursor may be less than 2000 sccm, or less than 1000 sccm, or less than 500 sccm, or less than 100 sccm. The vanadium precursor flow rate may be, for example, form 500 sccm 1200 sccm, such as 600 sccm, 800 sccm or 1000 sccm. The time period may vary according to the vanadium precursor in question and other process parameters, which may be selected according to the application in question.

In some embodiments, the method comprises removing excess vanadium precursor from the reaction chamber by an inert gas prior to providing the reducing agent in the reaction chamber. In some embodiments, the reaction chamber is purged between providing a vanadium precursor in a reaction chamber and providing a reducing agent in the reaction chamber.

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reducing agent. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.05 to about 20 seconds, or from about 0.2 to about 10 seconds, or between about 0.5 and about 5 seconds. However, other purge times can be utilized if necessary, such as where highly conformal step coverage over extremely high aspect ratio structures or other structures with complex surface morphology is needed, or where different reactor types, such as a batch reactor, are used.

In some embodiments, the method according to the current disclosure comprises a thermal deposition process. In thermal deposition, the chemical reactions are promoted by increased temperature relevant to ambient temperature. Generally, temperature increase provides the energy needed for the formation of vanadium metal in the absence of other external energy sources, such as plasma, radicals, or other forms of radiation. In some embodiments, the method according to the current disclosure is in part or completely a plasma-enhanced deposition method, for example PEALD or PECVD.

In some embodiments, a duration of providing the reducing agent to the reaction chamber (i.e. reducing agent pulse time) is greater than or equal to about 5 seconds, or greater than or equal to about 10 seconds, or greater than or equal to about 30 seconds, or between about 5 seconds and about 10 seconds, or between about 10 seconds and about 60 seconds. In some embodiments, a duration of providing the reducing agent to the reaction chamber is less than about 20 seconds, less than about 10 seconds, less than about 5 seconds, less than about 2 seconds, or less than about 0.1 seconds. In some embodiments, the reducing agent pulse time is between about 0.1 seconds and 15 seconds, or between about 0.1 seconds and 5 seconds, or between about 0.1 seconds and 3 seconds, or between about 5 seconds and 15 seconds, or between about 7 seconds and 10 seconds.

In some embodiments, providing a reducing agent to the reaction chamber comprises pulsing the reducing agent over the substrate. In embodiments where a reducing agent is pulsed over the substrate, the reducing agent may be pulsed for a time period of between 0.1 seconds and 2.0 seconds or from about 0.01 seconds to about 10 seconds or less than about 60 seconds, or less than about 30 seconds, or less than about 20 seconds, less than about 10 seconds or less than about 5 seconds. During the pulsing of the reducing agent over the substrate the flow rate of the reducing agent may be less than 2000 sccm, or less than 1000 sccm, or less than 500 sccm, or less than 100 sccm. The reducing agent flow rate may be, for example, from 500 sccm 1200 sccm, such as 600 sccm, 800 sccm or 1000 sccm. The time period may vary according to the reducing agent in question and other process parameters, which may be selected according to the application in question.

In some embodiments, the vanadium metal may be deposited at a temperature from about 20° C. to about 800° C. For example, vanadium metal may be deposited at a temperature from about 20° C. to about 450° C., such as from about 50° C. to about 450°, or at a temperature from about 450° C. to about 800° C. In some embodiments of the current disclosure, vanadium metal may be deposited at a temperature from about 20° C. to about 300° C., or at a temperature from about 300° C. to about 600° C. In some embodiments, vanadium metal may be deposited at a temperature from about 50° C. to about 150° C., or at a temperature from about 350° C. to about 400° C., or at a temperature from about 500° C. to about 700° C. For example, vanadium metal may be deposited at a temperature of about 75° C. or about 125° C., or about 175° C., or about 225° C., or about 250° C. or about 325° C., or about 375° C., or about 550° C., or about 650° C., or about 750° C.

In some embodiments, a pressure within the reaction chamber during the deposition process is less than 760 Torr, or wherein the pressure within the reaction chamber during the deposition process is between 0.2 Torr and 760 Torr, or between 1 Torr and 100 Torr, or between 1 Torr and 10 Torr. In some embodiments, the deposition of vanadium metal is performed at a pressure of less than about 0.001 Torr, less than 0.01 Torr, less than 0.1 Torr, less than 10 Torr or less than 50 Torr. In some embodiments, the pressure of the reaction chamber during at least a part of the method according to the current disclosure is less than about 0.001 Torr, less than 0.01 Torr, less than 0.1 Torr, less than 10 Torr or less than 50 Torr.

In one aspect, a vanadium metal-containing layer is disclosed. The vanadium metal-containing layer according to the current disclosure comprises vanadium metal deposited according to the processes described herein.

In another aspect, a structure comprising a vanadium metal-containing layer produced according to the processes described herein is disclosed.

In yet another aspect, a device comprising a vanadium metal-containing layer produced according to the process described herein is disclosed.

In a further aspect, a deposition assembly for depositing elemental vanadium on a substrate is disclosed. The deposition assembly comprises one or more reaction chambers constructed and arranged to hold the substrate, and a precursor injector system constructed and arranged to provide a vanadium precursor and/or a reducing agent into the reaction chamber. The deposition assembly comprises a precursor vessel constructed and arranged to contain and evaporate a vanadium precursor, and the assembly is constructed and arranged to provide the precursor via the precursor injector system to the reaction chamber to deposit elemental vanadium on the substrate.

DETAILED DESCRIPTION OF THE DRAWINGS

Figure 1B:
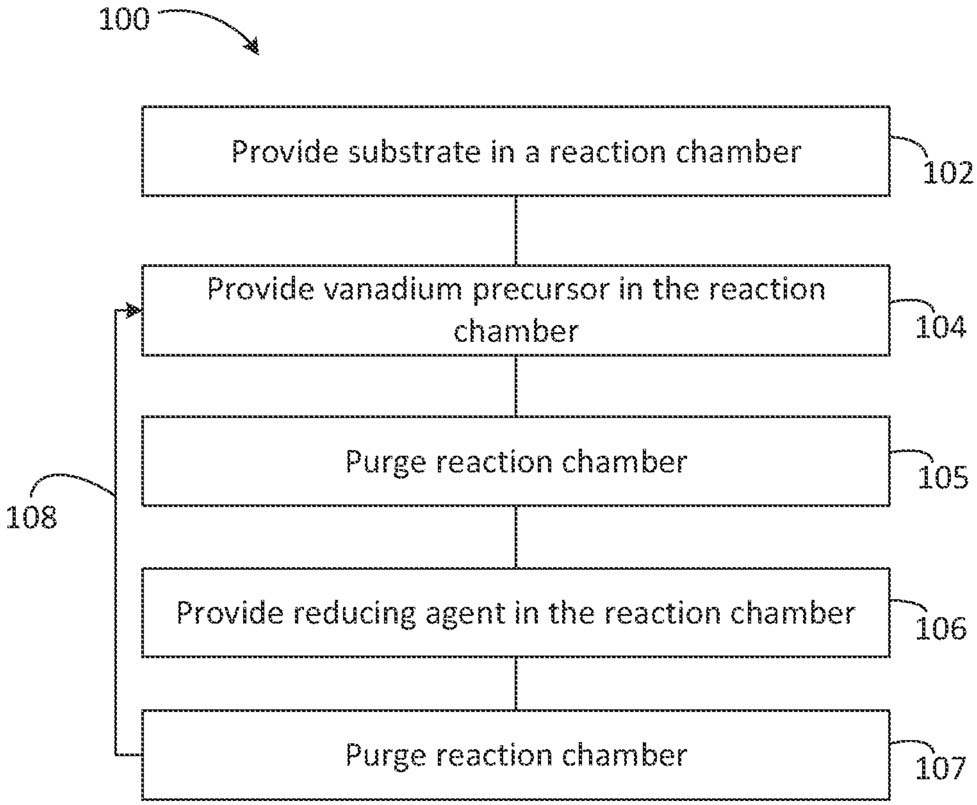

FIGS. 1A and 1B illustrate a method 100 in accordance with exemplary embodiments of the disclosure. Method 100 may be used to form a layer comprising vanadium metal, i.e. a vanadium metal-containing layer. The vanadium metal-containing layer can be used during a formation of a structure or a device, such as a structure or a device described herein. However, unless otherwise noted, methods are not limited to such applications.

During step 102, a substrate is provided into a reaction chamber of a reactor. The reaction chamber can form part of an atomic layer deposition (ALD) reactor. The reactor may be a single wafer reactor. Alternatively, the reactor may be a batch reactor. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, a reactor including the reaction chamber can be provided with a heater to activate the reactions by elevating the temperature of one or more of the substrate and/or the reactants and/or precursors.

During step 102, the substrate can be brought to a desired temperature and pressure for providing vanadium precursor in the reaction chamber 104 and/or for providing reducing agent in the reaction chamber 106. A temperature (e.g. of a substrate or a substrate support) within a reaction chamber can be, for example, from about 50° C. to about 500° C., or from about 250° C. to about 750° C. As a further example, a temperature within a reaction chamber can be from about 20° C. to about 300° C., or from about 400° C. to about 8000° C. Exemplary temperatures within the reaction chamber are 75° C., 125° C., 225° C., 275° C., 350° C., 550° C. and 700° C.

A pressure within the reaction chamber can be less than 760 Torr, less than 500 Torr, less than 100 Torr, less than 50 Torr or less than 20 Torr, less than 5 Torr, less than 1 Torr or less than 0.1 Torr.

Vanadium precursor is provided in the reaction chamber 104 containing the substrate. Without limiting the current disclosure to any specific theory, vanadium precursor may chemisorb on the substrate during providing vanadium precursor in the reaction chamber 104. The duration of providing vanadium precursor in the reaction chamber (vanadium precursor pulse time) may be, for example 0.01 s, 0.1 s, 0.5 s, 1 s, 1.5 s, 2 s, 2.5 s, 3 s, 3.5 s, 4 s, 5 s or 5 s, 10 s, 20 s, 40 s or 60 s. In some embodiments, the duration of providing vanadium precursor in the reaction chamber (vanadium precursor pulse time) is may be more than 5 s or more than 10 s or more than about 30 s, for example about 45 s. In some embodiments, vanadium precursor pulse time may be shorter than 15 s.

When reducing agent is provided in the reaction chamber 106, it may react with the chemisorbed vanadium precursor, or its derivate species, to form vanadium metal. The duration of providing reducing agent in the reaction chamber (reducing agent pulse time) may be, for example 0.01 s, 0.1 s, 0.5 s, 1 s, 2 s, 3 s, 4 s, 5 s, 7 s, 8 s, 9 s, 10 s, 15 s, 20 s, 30 s or 45 s. In some embodiments, the duration of providing reducing agent in the reaction chamber is be less than 15 s or less than 10 s or about 3 s. However, in some embodiments, the duration of providing reducing agent in the reaction chamber is longer than 15 s, longer than 30 s, or longer than 45 s, for example about 50 s or 60 s.

Stages 104 and 106, performed in any order, may form a deposition cycle, resulting in the deposition of vanadium metal. In some embodiments, the two stages of vanadium metal deposition, namely providing the vanadium precursor and the reducing agent in the reaction chamber (104 and 106), may be repeated (loop 108). Such embodiments contain several deposition cycles. The thickness of the deposited vanadium metal may be regulating by adjusting the number of deposition cycles. The deposition cycle (loop 108) may be repeated until a desired vanadium metal thickness is achieved. For example from 2 to about 2,000, such as from about 10 to about 2,000, from about 50 to about 2,000 or from about 500 to about 2,000 deposition cycles may be performed. In some embodiments, from 2 to about 10, or from 2 to about 50 or from 2 to about 100, or from 2 to about 200, or from 2 to about 500 or from 2 to about 1,000 deposition cycles may be performed. For example, about 2, 5, 10, 50 or 100 deposition cycles may be performed. In some embodiments, about 150, 200, 250, 300, 400, 500, 600, 700, 800, 900, 1,200 or 1,500 deposition cycles may be performed.

The amount of vanadium metal deposited during one cycle (growth per cycle, GPC) varies depending on the process conditions, and may be, from about 0.01 Å/cycle to about 6 Å/cycle, such as from about 0.01 Å/cycle to about 0.5 Å/cycle, or from about 0.01 Å/cycle to about 2 Å/cycle. In some embodiments, GPC may be from about 0.5 Å/cycle to about 6 Å/cycle, or from about 1 Å/cycle to about 5 Å/cycle. In some embodiments, GPC may be for example 0.03 Å/cycle, 0.05 Å/cycle, 0.1 Å/cycle, 0.15 Å/cycle, 0.2 Å/cycle, 0.25 Å/cycle or 0.3 Å/cycle, 1 Å/cycle, 3 Å/cycle or 5 Å/cycle. Depending on the deposition conditions, deposition cycle numbers etc., vanadium metal or vanadium metal-containing layers of variable thickness may be deposited. For example, vanadium metal or vanadium metal-containing layer may have a thickness between approximately 0.3 nm and 50 nm, such as approximately 0.5 nm, 1 nm, 1.5 nm, 2 nm, 2.5 nm, 3 nm, 3.5 nm, 4 nm, 4.5 nm, 5 nm, 6 nm, 7 nm, 8 nm, 10 nm, 15 nm, 20 nm or 25 nm. In some embodiments, the vanadium metal or vanadium metal-containing layer may have a thickness of approximately 30 nm, 40 nm or 50 nm. The desired thickness may be selected according to the application in question. For example filling applications may utilize thicker layers than, for example liners or other layers where space is limited.

Vanadium precursor and reducing agent may be provided in the reaction chamber in separate steps (104 and 106). FIG. 1B illustrates an embodiment according to the current disclosure, where steps 104 and 106 are separate by purge steps 105 and 107. In such embodiments, a deposition cycle comprises one or more purge steps 103, 105. During purge steps, precursor and/or reducing agent can be temporally separated from each other by inert gases, such as argon (Ar), nitrogen ($N_2$) or helium (He) and/or a vacuum pressure.

Purging the reaction chamber 103, 105 may prevent or mitigate gas-phase reactions between a vanadium precursor and a reducing agent, and enable self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a vanadium precursor and a reducing agent. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, vanadium metal is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a vanadium precursor and a reducing agent. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reducing agent or precursor and the periodic pulsing of the other chemical component into the reaction chamber. The temperature and/or pressure within a reaction chamber during step 104 can be the same or similar to any of the pressures and temperatures noted above in connection with step 102.

Figure 2:
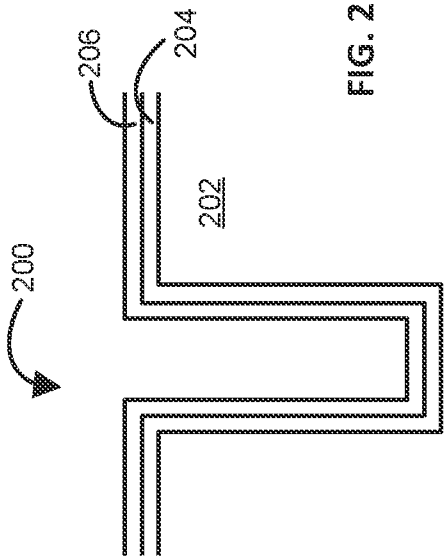
FIG. 2 depicts a structure comprising a vanadium metal-containing layer according to the current disclosure in a schematic manner.

FIG. 2 illustrates an exemplary structure, or a portion of a device, 200 in accordance with the disclosure. Portion of a device or structure 200 includes a substrate 202, a vanadium layer 204, and an optional underlayer 206 in between (e.g., in contact with one or both) substrate 202 and vanadium metal-containing layer 204. Substrate 202 can be or include any of the substrate material described herein, such as a dielectric or insulating layer. By way of example, dielectric or insulating layer can be high-k material, such as, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO2$), tantalum oxide ($Ta2O5$), zirconium oxide ($ZrO2$), titanium oxide ($TiO2$), hafnium silicate ($HfSiOx$), aluminum oxide ($Al2O3$), lanthanum oxide ($La2O3$), titanium nitride, and mixtures/laminates comprising one or more such layers.

Vanadium metal-containing layer 204 can be formed according to a method described herein. When an underlayer 206 is formed using a cyclical deposition process, a concentration of underlayer 206 constituents (e.g., a transition metal, C, S, or N) can vary from a bottom of underlayer 206 to a top of underlayer 206 by, for example, controlling an amount of precursor and/or reactant(s) and/or respective pulse times during one or more deposition cycles. An underlayer may be a seed layer.

In some embodiments, a vanadium metal-containing layer may be deposited directly on the substrate. In such embodiments, there is no underlayer. As a further alternative, the structure or a device according to the current disclosure may comprise additional layers between substrate and vanadium metal-containing layer. Further, in some embodiments, a vanadium-containing layer is deposited on the substrate, and at least one additional layer is deposited on the vanadium-containing layer. In some further embodiments, vanadium-containing layer according to the current disclosure may be used as a seed layer in the deposition of other layers.

In some embodiments, vanadium metal-containing layer 204 can consist essentially of, or consist of vanadium metal.

Structures and devices in accordance with examples of the disclosure can include horizontal structures, vertical and/or three-dimensional structures and devices, such as FinFET devices, gate all around devices and nanosheet devices.

Figure 3:
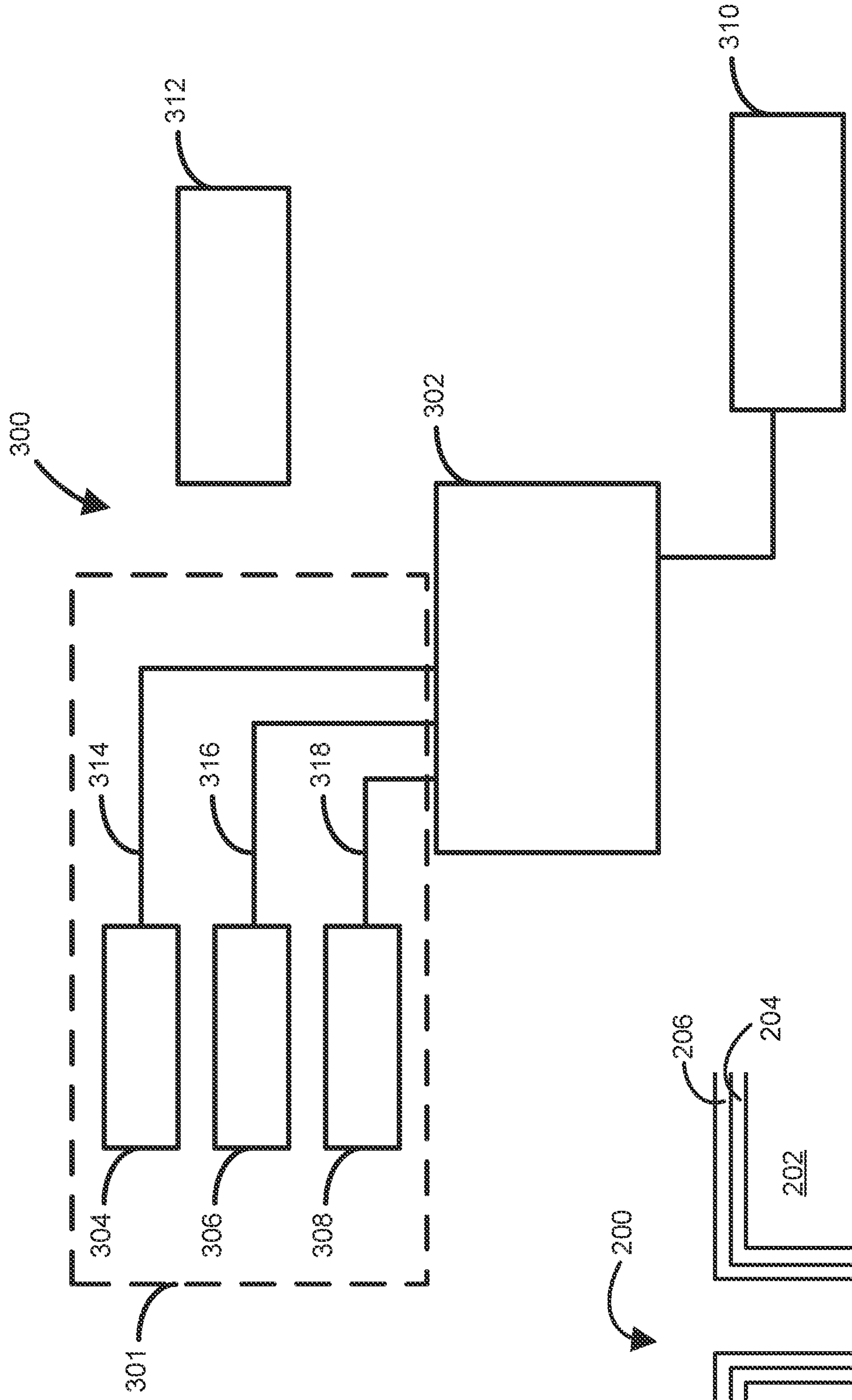
FIG. 3 presents a deposition apparatus according to the current disclosure in a schematic manner.

FIG. 3 illustrates a deposition assembly 300 according to the current disclosure in a schematic manner. Deposition assembly 300 can be used to perform a method as described herein and/or to form a structure or a device, or a portion thereof as described herein.

In the illustrated example, deposition assembly 300 includes one or more reaction chambers 302, a precursor injector system 301, a vanadium precursor vessel 304, reducing agent vessel 306, a purge gas source 308, an exhaust source 310, and a controller 312.

Reaction chamber 302 can include any suitable reaction chamber, such as an ALD or CVD reaction chamber.

The vanadium precursor vessel 304 can include a vessel and one or more vanadium precursors as described herein—alone or mixed with one or more carrier (e.g., inert) gases. Reducing agent vessel 306 can include a vessel and one or more reducing agents as described herein—alone or mixed with one or more carrier gases. Purge gas source 308 can include one or more inert gases as described herein. Although illustrated with three source vessels 304-308, deposition assembly 300 can include any suitable number of source vessels. Source vessels 304-308 can be coupled to reaction chamber 302 via lines 314-318, which can each include flow controllers, valves, heaters, and the like.

Exhaust source 310 can include one or more vacuum pumps.

Controller 312 includes electronic circuitry and software to selectively operate valves, manifolds, heaters, pumps and other components included in the deposition assembly 300. Such circuitry and components operate to introduce precursors, reducing agents and purge gases from the respective sources 304-308. Controller 312 can control timing of gas pulse sequences, temperature of the substrate and/or reaction chamber 302, pressure within the reaction chamber 302, and various other operations to provide proper operation of the deposition assembly 300. Controller 312 can include control software to electrically or pneumatically control valves to control flow of precursors, reducing agents and purge gases into and out of the reaction chamber 302. Controller 312 can include modules such as a software or hardware component, which performs certain tasks. A module may be configured to reside on the addressable storage medium of the control system and be configured to execute one or more processes.

Other configurations of deposition assembly 300 are possible, including different numbers and kinds of precursor and reducing agent sources and purge gas sources. Further, it will be appreciated that there are many arrangements of valves, conduits, precursor sources, and purge gas sources that may be used to accomplish the goal of selectively and in coordinated manner feeding gases into reaction chamber 302. Further, as a schematic representation of an deposition assembly, many components have been omitted for simplicity of illustration, and such components may include, for example, various valves, manifolds, purifiers, heaters, containers, vents, and/or bypasses.

During operation of deposition assembly 300, substrates, such as semiconductor wafers (not illustrated), are transferred from, e.g., a substrate handling system to reaction chamber 302. Once substrate(s) are transferred to reaction chamber 302, one or more gases from gas sources 304-308, such as precursors, reducing agents, carrier gases, and/or purge gases, are introduced into reaction chamber 302.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing vanadium metal on a substrate, the method comprising providing a substrate in a reaction chamber;

providing a vanadium precursor to the reaction chamber in a vapor phase; and providing a reducing agent to the reaction chamber in a vapor phase to form vanadium metal on the substrate, wherein the reducing agent comprises one or more of a diazenyl compound, an amino complex containing an Al—H bond, or an amido complex containing an Al—H bond.

2. The method according to claim 1, wherein the reducing agent comprises an amino complex containing an Al—H bond or an amido complex containing an Al—H bond.

3. The method according to claim 1, wherein a temperature within the reaction chamber during the deposition process is between 300° C. and 800° C.

4. The method according to claim 3, wherein the reducing agent comprises a diazenyl compound.

5. The method according to claim 1, wherein the reducing agent comprises aluminum.

6. The method according to claim 1, wherein the reducing agent comprises an amino complex containing an Al—H bond.

7. The method according to claim 1, wherein the deposition process alternatively and sequentially providing a vanadium precursor and a reducing agent in the reaction chamber and purging the reaction chamber between providing the vanadium precursor and the reducing agent in the reaction chamber.

8. The method of claim 1, wherein the deposition process comprises a thermal deposition process.

9. The method of claim 1, wherein a pressure within the reaction chamber during the deposition process is less than 760 Torr.

* * * * *